(12) United States Patent
Yoshizawa et al.

(10) Patent No.: US 6,548,214 B2
(45) Date of Patent: Apr. 15, 2003

(54) METHOD OF LITHOGRAPHY UTILIZING ORTHOGONAL EXPERIMENT TO IMPROVE PROFILE

(75) Inventors: Noritsugu Yoshizawa, Saitama (JP); Masaki Yoshizawa, Kanagawa (JP); Shigeru Moriya, Kanagawa (JP)

(73) Assignee: Sony Corporation (JP)

( * ) Notice: Subject to any disclaimer, the term of this patent is extended or adjusted under 35 U.S.C. 154(b) by 43 days.

(21) Appl. No.: 09/847,329

(22) Filed: May 3, 2001

(65) Prior Publication Data

US 2002/0051127 A1 May 2, 2002

(30) Foreign Application Priority Data

May 12, 2000 (JP) ........................................ 2000-139484

(51) Int. Cl.$^7$ .................................................. G03C 5/00

(52) U.S. Cl. ........................ 430/30; 430/313; 430/315; 430/327; 430/330

(58) Field of Search .......................... 430/30, 313, 315, 430/327, 330

(56) References Cited

U.S. PATENT DOCUMENTS 5,648,198 A * 7/1997 Shibata ........................ 430/296
6,420,098 B1 * 7/2002 Mautz ........................ 430/313

* cited by examiner

*Primary Examiner*—Christopher G. Young
(74) *Attorney, Agent, or Firm*—Rader, Fishman & Grauer PLLC; Ronald P. Kananen, Esq.

(57) ABSTRACT

A method of lithography capable of optimizing its process condition more simply and precisely based on a limited number of experiments is provided. A line edge roughness of a resist pattern is obtained as a characteristic value for evaluation. The resist pattern is formed in an orthogonal experiment based on an orthogonal table that includes significant factors, which define a process condition of its lithography. Reference level (benchmark) values are set for each factor in the orthogonal experiment, from which an appropriate reference level value which minimizes the edge roughness is selected as a process condition for proceeding with the lithography. By provision of the edge roughness criterion as the characteristic value which has satisfactory reproducibility, can reflect a change in the process condition very sensitively, and has a linear correlation with respect to the resolution, the influences of respective process conditions on the resolution can be reflected more precisely and with an improved reproducibility.

14 Claims, 3 Drawing Sheets

METHOD OF LITHOGRAPHY UTILIZING ORTHOGONAL EXPERIMENT TO IMPROVE PROFILE

BACKGROUND OF THE INVENTION

1. Field of the Invention

The present invention relates to a method of lithography and, in particular, a method of lithography in which an optimal process condition can be selected simply and precisely.

2. Description of the Related Art

Recently, in line with an increasingly fine patterned structuring of electronic devices due to advancements on very large scale integration and multifunctional characteristics in semiconductor devices, various types of lithographic technology have been developed. For example, in a lithographic method using an ArF excimer laser beam or an electron beam as its exposure beam, a process using a chemically amplified resist is now becoming a mainstream.

In these lithographic methods using the chemically amplified resist, there are essential conditions required when forming a high precision resist pattern such as a pre-bake (hereinafter referred to simply as PB) condition necessary after coating of a resist, a post exposure bake (hereinafter referred to simply as PEB) condition necessary after exposure of the resist, and optimization of developing conditions necessary after PEB or the like.

As a result, when performing lithographic processing, these process conditions are optimized through bench tests or evaluation experiments on each process condition and by selection of optimal values thereof at which an optimized resolution is obtained.

However, these optimal values necessary for the above-mentioned process conditions vary depending on various process parameters, such as the patterning area (an area of exposure), the film thickness of its resist and the like. As a result, in order to optimize these process conditions, it becomes necessary to carry out a respective evaluation experiment or a bench test for each of these process parameters, thereby requiring substantial time and labor.

SUMMARY OF THE INVENTION

The present invention has been conceived in order to solve the problems associated with the conventional process and to provide a novel method of lithography that enables the optimization of the process conditions simply and precisely upon a reduced number of experiments required therefor.

According to the present invention, in order to solve the above-mentioned problem, a resist pattern is formed on the basis of an orthogonal experiment that is carried out by varying each process condition, and a line edge roughness of such formed resist pattern is obtained as a characteristic value for evaluation. Then, a value at a respective reference (benchmark) level set for each factor in the orthogonal experiments and at which value the edge roughness becomes minimal is selected for its lithographic process. Further, the orthogonal experiment is carried out on the basis of an orthogonal table therefor.

According to such method of lithography of the present invention, the orthogonal experiment having a high reproducibility therefore has a satisfactory high reproducibility, a change in its process conditions is reflected with high sensitivity, and an edge roughness having a linear correlation relative to the resolution of the patterning is used as a characteristic value for evaluation. Therefore, an optimal process condition including respective factors for an improved resolution can be selected more precisely and at high reproducibility by reflecting a specific effect of each process condition or factor on the resolution. Further, because of the fact that the orthogonal experiment is conducted based on the orthogonal table, a result of experiments having high reproducibility can be obtained with a substantially reduced number of experiments.

In other words, the method of lithography according to the present invention described hereinabove enables advantageously the reflection of an influence of change in each process condition over the resolution of the resist patterning more precisely and with an improved reproducibility, so that an optimal process condition that allows the resolution to become maximum can be selected simply and precisely, thereby ensuring a higher precision resist pattern to be formed. In addition, the experiments conducted based on the orthogonal tables of the invention ensure that an appropriate process condition will select more simply and with a reduced number of experiments.

BRIEF DESCRIPTION OF THE DRAWINGS

The foregoing and other objects, features and advantages of the present invention will be apparent to those skilled in the art from the following description of the preferred exemplary embodiments of the present invention taken in conjunction with the accompanying drawings, in which.

DESCRIPTIONS OF THE PREFERRED EMBODIMENTS

Figure 1:
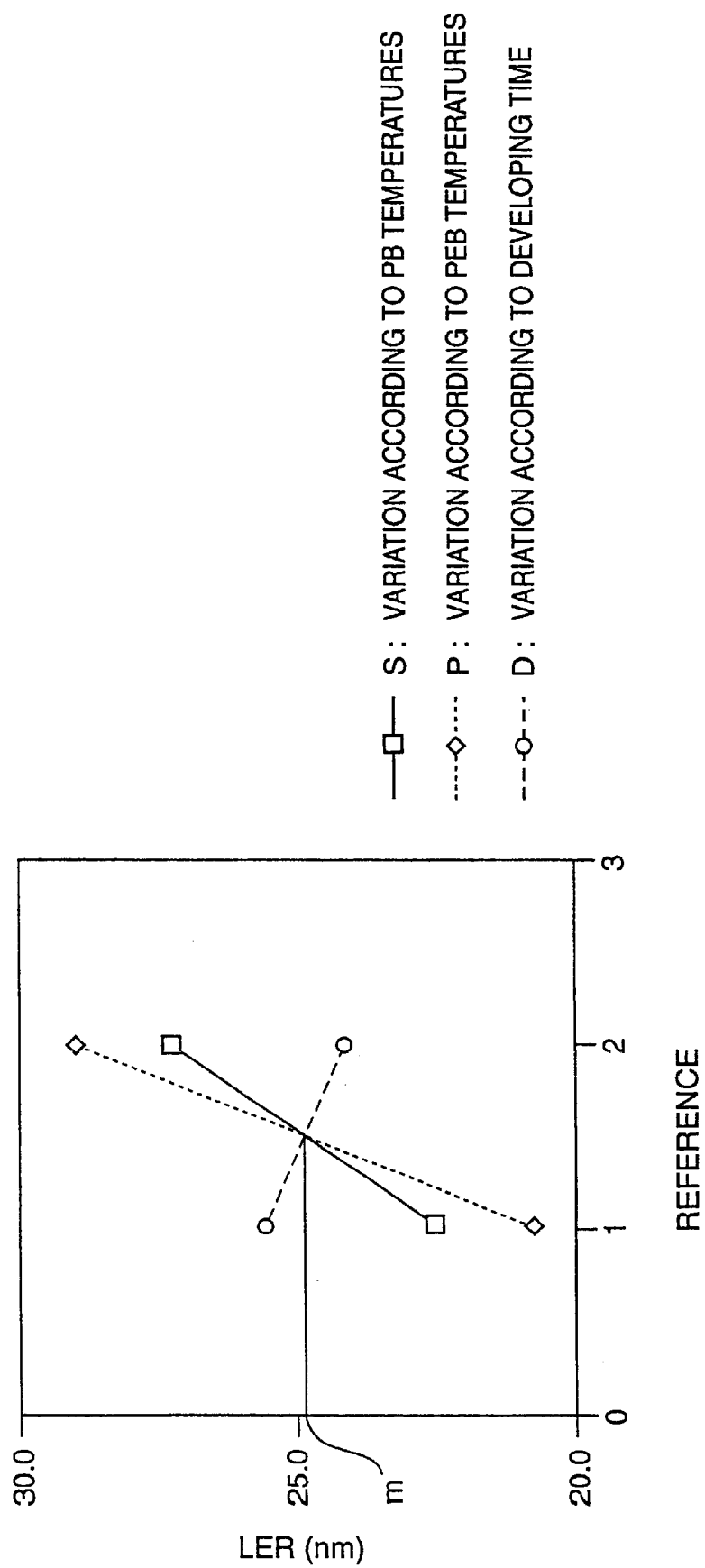
FIG. 1 is a diagram showing variations of a line edge roughness (LER) depending on a respective factor and its value at each reference level (benchmark) number in the case of forming lines and spaces (L/S) on a whole surface of a wafer (hereinafter, referred to as a whole surface L/S)

A preferred embodiment of the method of lithography according to the present invention will be described in detail with reference to the accompanying drawings and tables in the following. A method of forming a resist pattern in which various process conditions required for its lithography are optimized will be described by way of an example of a-lithographic method using an exposure apparatus of an electron beam direct drawing method in the following.

First, an appropriate process condition that has a significant influence on the resolution of the resist pattern is selected from various process conditions required for the lithography as its appropriate factor, and then an appropriate number of reference levels (benchmarks) for each factor and an appropriate value of each factor at the appropriate reference levels (benchmarks) are established.

As for these process conditions, there are selected, for example, a process temperature and a process time in a hexamethyldisilazane (HMDS) process, a process temperature and a process time in the pre-bake (PB), a process temperature and a process time in the post-exposure bake (PEB), a temperature in a developing solution, a developing time and a concentration in the developing solution in a developing process, and a process temperature and a process time in a post bake process.

As an example, as shown in TABLE 1, relevant factors selected include the process temperature in the PB (hereinafter referred to as PB temperature), the process temperature in the PEB (hereinafter referred to as PEB temperature) and the developing time in the developing process; and, their reference (bench test) values of respective factors are set at two reference levels (benchmarks) No. 1 and No. 2, as shown in TABLE 1.

TABLE 1

| Nos. of Combination | BP Temp. | PEB Temp. | Develop. Time |
|---|---|---|---|
| 1 | 1 | 1 | 1 |
| 2 | 1 | 1 | 2 |
| 3 | 1 | 2 | 1 |
| 4 | 1 | 2 | 2 |
| 5 | 2 | 1 | 1 |
| 6 | 2 | 1 | 2 |
| 7 | 2 | 2 | 1 |
| 8 | 2 | 2 | 2 |

In addition, by selecting Nos. 1, 4, 6 and 7 from the combination column of TABLE 1, an orthogonal table "$L_4(2^3)$", as shown in the following TABLE 2, is compiled.

TABLE 2

$L_4(2^3)$

| Nos. of Combination | BP Temp. | PEB Temp. | Develop. Time |
|---|---|---|---|
| 1 | 1 | 1 | 1 |
| 4 | 1 | 2 | 2 |
| 6 | 2 | 1 | 2 |
| 7 | 2 | 2 | 1 |

Subsequently, the orthogonal experiments are conducted to form respective resist patterns by carrying out respective lithographic processing based on this orthogonal table. In these experiments, process conditions other than the factors selected above (such as film thickness of the resist, patterning area and so on) are set constant, for example, as follows.

| Resist: | FEP102 (chemically amplified resist manufactured by Fuji Film Ohrin K.K.) |
|---|---|
| Film thickness: | 0.3 μm |
| PB time: | 90 sec. |
| PEB time: | 90 sec. |
| Developing solution temperature: | 23° C. |
| Developer type: | Paddle E2 nozzle (spin developer with a shower nozzle) |
| Design pattern: | a line pattern of 150 nm width. |

Further, reference (bench test) values of respective factors are assumed to have been set, for example, as indicated in the following TABLE 3. These reference values are estimated, for example, from a series of basic evaluations conducted prior to the orthogonal experiment. Here, it is assumed that a current condition is the reference level No. 2 and that a current process condition is the combination No. 8 indicated in TABLE 1.

TABLE 3

REFERENCE VALUES FOR FACTORS

| RUN NOS. | PB TEMP. (° C.) | PEB TEMP. (° C.) | DEVEL. TIME (SEC) |
|---|---|---|---|
| 1 (NO. 1) | 110 | 105 | 40 |
| 2 (NO. 4) | 110 | 110 | 60 |
| 3 (NO. 6) | 120 | 105 | 60 |
| 4 (NO. 7) | 120 | 110 | 40 |

In these orthogonal experiments, the following types of experiments are conducted, as required: an experiment to form lines and spaces on a whole surface of a wafer (a whole surface L/S); an experiment to form 5 lines and spaces on the wafer (5 L/S); and an experiment to form an isolated line pattern on the wafer (isolated line).

In a next step, a line edge roughness (LER) is measured for the line of each resist pattern formed in each orthogonal experiment. Here, the line edge roughness refers to the degree of irregularities at the edge portion of the resist pattern formed by lithography, and, more specifically, it is indicated by the average value of differences between a maximum value C Dmax and a minimum value C Dmin for a line width, for example, in each partitioned portion of the resist pattern.

The result of measurements on the line edge roughness obtained in respective orthogonal experiments is shown in the following TABLE 4. For the measurements of the line edge roughness, for example, a length measuring scanning electron microscope (SEM) (KLA-8100: manufactured by KLA TENCOR) is used. A respective maximum value C Dmax and a minimum value C Dmin for a respective line width in its respective portion partitioned by 5 μm are measured, and an average value for differences in width is calculated as its edge roughness. Advantageously, because of the measurements in the line widths of the resist pattern using the length measuring SEM, the edge roughness can be obtained through a non-destructive method without a cross-sectional observation of a cutout portion.

TABLE 4

VALUES OF LER MEASURED IN ORTHOGONAL EXPERIMENTS (UNIT: nm)

| RUN NO. | WHOLE SURFACE L/S | 5 L/S | ISOLATED LINE |
|---|---|---|---|
| 1 (NO. 1) | 19.0 | 27.6 | 20.7 |
| 2 (NO. 4) | 25.9 | 22.2 | 14.5 |
| 3 (NO. 6) | 22.4 | 19.1 | 15.2 |
| 4 (NO. 7) | 32.1 | 31.6 | 28.4 |

Then, the result of the measurements of the edge roughness is analyzed, as shown in the following, and a combination of reference values that minimize its edge roughness are selected as appropriate values for respective process conditions to carry out the lithography according to each layout of the line patterning described above.

Here, assuming that the average value of the edge roughness is "m", the variation of the edge roughness due to a change in the factor 1 which is the PB temperature is "S", the variation of the edge roughness due to a change in the factor 2 which is the PEB temperature is "P", the variation of the edge roughness due to a change in the factor 3 which is the developing time is "D", the reference level No. 1 is "(−)", and the reference level No. 2 is "(+)", then the respective measured values of the edge roughness "LER" obtained in the experiments RUN #1 through RUN #4 are expressed in the following mathematical expressions.

| RUN #1: | LER = m − S − P − D |
| RUN #2: | LER = m − S + P + D |
| RUN #3: | LER = m + S − P + D |
| RUN #4: | LER = m + S + P − D. |

By substituting into these mathematical expressions the measured values of the edge roughness obtained in the experiments RUN #1 through RUN #4, respective variations S, P and D of the edge roughness due to respective factors are obtained as follows.

| (1): in case of the whole surface L/S | |
|---|---|
| RUN #1: | LER = m − S − P − D = 19.0 |
| RUN #2: | LER = m − S + P + D = 25.9 |
| RUN #3: | LER = m + S − P + D = 22.4 |
| RUN #4: | LER = m + S + P − D = 32.1. |

Thereby, there are obtained from these mathematical expressions m=24.85, S=2.40, P=4.15 and D=−0.7, respectively.

FIG 1 shows variations of the edge roughness (LER) according to each factor and their reference values at each reference level (benchmark) number. As it can be realized from this graph, in order to minimize the edge roughness in the case of forming L/S on the whole surface of a wafer, it is preferable to select reference level No. 1 for both the PB temperature and the PEB temperature and reference level No. 2 for the developing time, that is to say, to select combination No. 2. In this case, it also can be realized that the PEB temperature has a major impact on the variation of the edge roughness.

With reference to TABLE 5, there are shown values of the line edge roughness obtained by analysis of the result of the orthogonal experiments carried out for all the combinations regarding the whole surface L/S pattern.

TABLE 5

RESULT OF ANALYSIS ON ORTHOGONAL EXPERIMENTS (WHOLE SURFACE L/S)

| COMBI. NOS. | PB TEMP. | PEB TEMP. | DEVEL. TIME | LER (nm) |
|---|---|---|---|---|
| 1 | −S | −P | −D | 19.0 |
| 2 | −S | −P | D | 17.6 |
| 3 | −S | P | −D | 27.3 |
| 4 | −S | P | D | 25.9 |
| 5 | S | −P | −D | 23.8 |
| 6 | S | −P | D | 22.4 |
| 7 | S | P | −D | 32.1 |
| 8 | S | P | D | 30.7 |

From this table, it is also known that in the case where L/S (lines and spaces) are to be formed on the whole surface of the wafer, combination No. 2 allows its computed value of the line edge roughness to become minimal.

| (2): in the case of 5 L/S | |
|---|---|
| RUN #1: | LER = m − S − P − D = 27.6 |
| RUN #2: | LER = m − S + P + D = 22.2 |
| RUN #3: | LER = m + S − P + D = 19.1 |
| RUN #4: | LER = m + S + P − D = 31.6. |

From these mathematical expressions, it is obtained that m=25.15, S=0.225, P=1.175, and D=−4.475.

Figure 2:
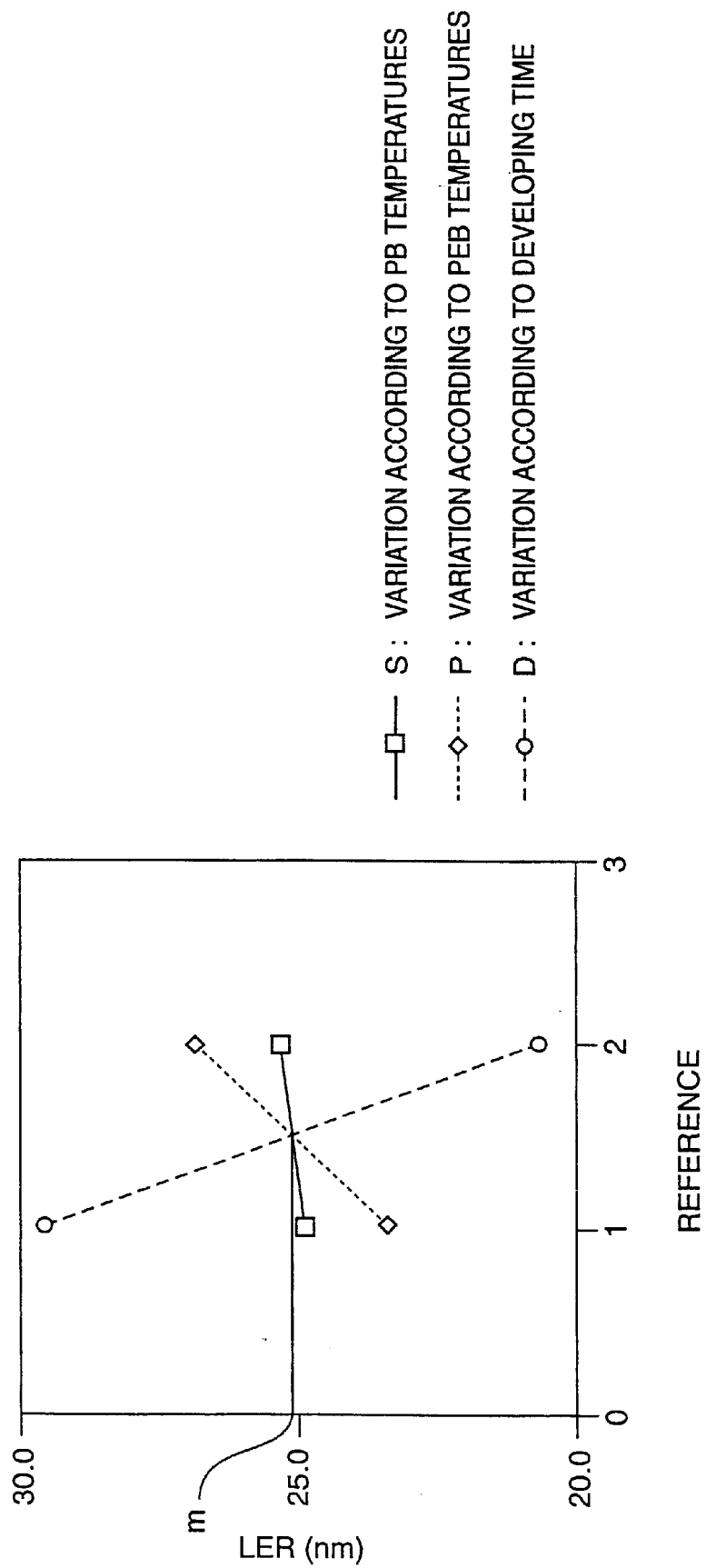
FIG. 2 is a diagram showing variations of the line edge roughness (LER) depending on a respective factor and its value at each reference level (benchmark) number in the case of forming five lines and spaces on the surface (hereinafter referred to as a 5 L/S)

FIG. 2 shows variations on the edge roughness according to each factor and their reference values at each reference level, which are plotted based on the above-mentioned values. As can be realized from this graph, in order to minimize the edge roughness in the case of forming the 5 L/S on the wafer, it is preferable that the PB temperature and the PEB temperature are selected from those at reference level No. 1 and the developing time is selected from that at the reference level No. 2, that is to say, it is preferable that combination No. 2 is selected. In this case, it is clearly shown that the developing time has a substantial impact on the variation of the edge roughness.

TABLE 6 shows values of the edge roughness for all combinations regarding the 5 L/S, which are obtained as: a result of analysis on the orthogonal experiments.

TABLE 6

RESULT OF ANALYSIS ON THE ORTHOGONAL EXPERIMENTS (FOR THE CASE OF THE 5 L/S)

| COMB. NO. | PB TEMP | PEB TEMP. | DEVEL. TIME | LER (nm) |
|---|---|---|---|---|
| 1 | −S | −P | −D | 27.6 |
| 2 | −S | −P | D | 18.65 |
| 3 | −S | P | −D | 31.15 |
| 4 | −S | P | D | 22.2 |
| 5 | S | −P | −D | 28.05 |
| 6 | S | −P | D | 19.1 |
| 7 | S | P | −D | 31.6 |
| 8 | S | P | D | 22.65 |

From this TABLE 6, it also is known that in the case of forming the 5 L/S on the wafer, combination No. 2 allows its computed value of the edge roughness to be minimized.

(3): in the case of the isolated line

| (3): in the case of the isolated line | |
|---|---|
| RUN #1: | LER = m − S − P − D = 20.7 |
| RUN #2: | LER = m − S + P + D = 14.5 |
| RUN #3: | LER = m + S − P + D = 15.2 |
| RUN #4: | LER = m + S + P − D = 28.4. |

From these mathematical expressions described above, it is calculated that m=19.7, S=2.10, P=1.75 and D=−4.85.

Figure 3:
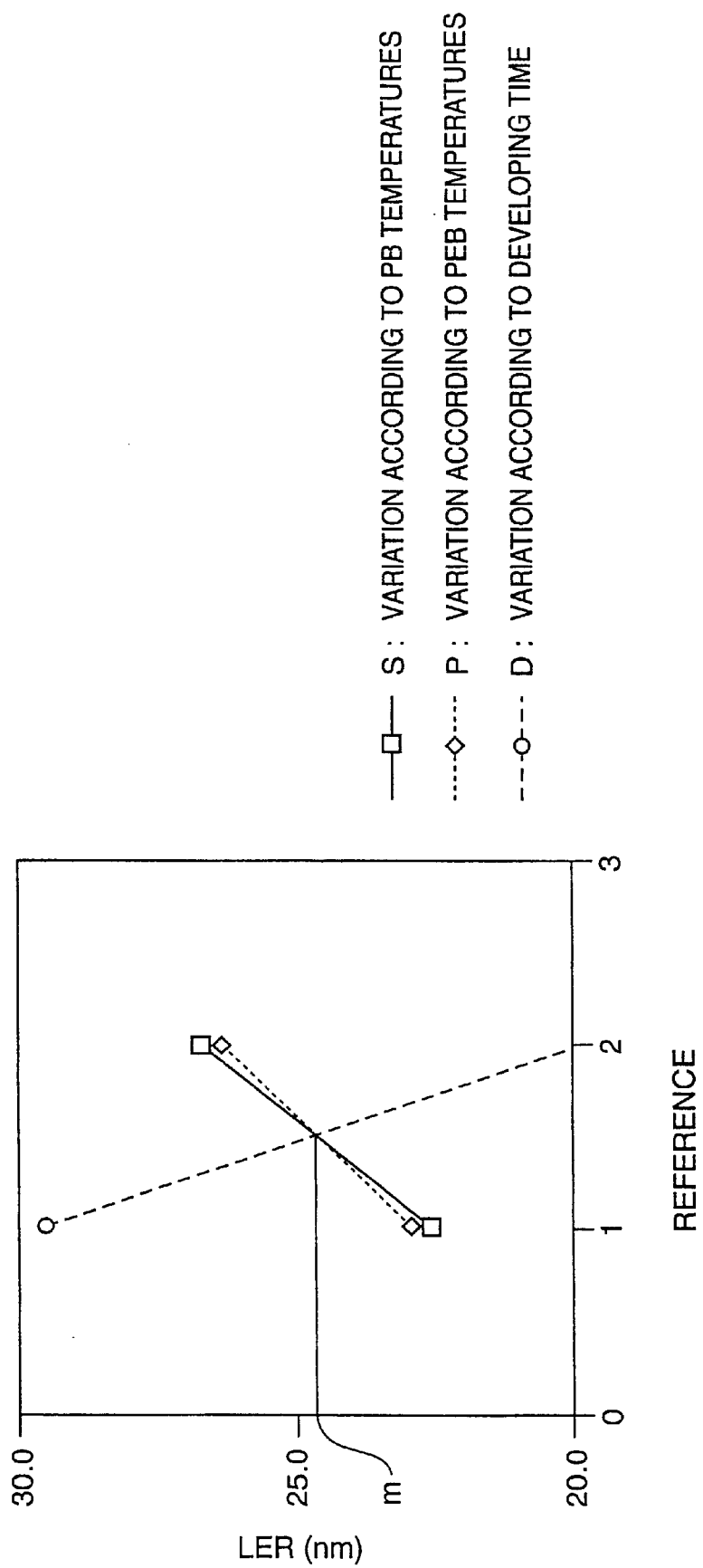
FIG. 3 is a diagram showing variations of the line edge roughness (LER) depending on a respective factor and its value at each reference level (benchmark) number in the case of forming an isolated line on the surface.

In FIG. 3, variations of the edge roughness according to the values of respective factors at each reference level obtained on the basis of the above-mentioned calculation are plotted. In order to minimize edge roughness when forming an isolated line on the wafer, it can be understood from this graph that preferably the PB and the PEB temperatures are selected from those at the reference level No. 1 and the developing time is selected from that at the reference level No. 2, that is to say, it is preferable to select the combination No. 2. In this instance, it known that the developing time has the largest impact on the variation of the edge roughness.

In TABLE 7, there are shown values of the edge roughness obtained as a result of analysis on the orthogonal experiments conducted for all combinations regarding the isolated line.

TABLE 7

RESULT OF ANALYSIS ON THE ORTHOGONAL
EXPERIMENTS (FOR THE CASE OF THE ISOLATED LINE)

| COMB. NO. | PB TEMP | PEB TEMP. | DEVEL. TIME | LER (nm) |
|---|---|---|---|---|
| 1 | −S | −P | −D | 20.7 |
| 2 | −S | −P | D | 11.0 |
| 3 | −S | P | −D | 24.2 |
| 4 | −S | P | D | 14.5 |
| 5 | S | −P | −D | 24.9 |
| 6 | S | −P | D | 15.2 |
| 7 | S | P | −D | 28.4 |
| 8 | S | P | D | 18.7 |

It known from this table that in the case of forming the isolated line on the wafer, the calculated value of the edge roughness becomes minimal for combination No. 2.

As a result of the analysis described above, it can be understood that the process conditions for combination No. 2 are preferably adopted in order to minimize the edge roughness, irrespective of the layout conditions of the pattern (a ratio of the drawing area).

Afterwards, a lithographic process having the aforementioned combination of the process conditions adopted on the basis of the analysis described above is executed to form a resist pattern on a wafer.

According to the method of lithography of the preferred embodiment of the invention, as described above, when performing the orthogonal experiments having a high reproducibility, a satisfactorily high reproducibility and a high sensitivity to a change in the process conditions are obtained, along with the fact that a linear correlation to the resolution of the patterning is used as the characteristic value for evaluation. Therefore, the effect of each process condition and its factors have on the resolution can be recognized more precisely and highly reproducibly, thereby enabling the selection of an optimal process condition for providing an improved resolution of the patterning. In addition, because of the orthogonal experiments that are carried out on the basis of the orthogonal tables, a preferred highly reproducible result of experiments can be obtained from a reduced number of experiments as compared to the related art. As a result, it is enabled very precisely to form a very fine resist pattern with a line width of 100 nm.

Now, with reference to TABLE 8, there is shown the result of measurements on the edge roughness for each resist pattern obtained in additional experiments of the lithographic process that were carried out under the process condition of combination No. 2 in comparison with the result of analysis on the edge roughness obtained in the orthogonal experiments described above. Further, as an example of comparison, the result of the additional experiments of the lithographic process that were carried out under the process condition of the current combination No. 8 is shown together with the result of the analysis of the orthogonal experiments.

TABLE 8

ADDITIONAL EXPERIMENTS IN COMPARISON WITH THE RESULT OF ANALYSIS

| | | L/S ON ALL SURFACE | 5 L/S | ISOLATED LINE |
|---|---|---|---|---|
| COMBI-NATION NO. 2 | RESULT OF ANALYSIS (nm) | 17.6 | 18.7 | 11.0 |
| | RESULT OF ADD. EXP. (nm) | 16.4 | 15.8 | 13.3 |
| | RESIST SENSITIVITY ($\mu C/cm^2$) | 12.1 | 16.7 | 17.3 |
| COMBI-NATION NO. 8 | RESULT OF ANALYSIS (nm) | 30.7 | 22.7 | 18.7 |
| | RESULT OF ADD. EXP. (nm) | 21.3 | 29.2 | 15.1 |
| | RESIST SENSITIVITY ($\mu C/cm^2$) | 10.6 | 15.5 | 17.3 |

As indicated in TABLE 8, through the lithographic processing which applied the process conditions obtained from the experiments based on the orthogonal table, it is confirmed that it is possible to form a further improved resist pattern with its edge roughness suppressed smaller than that obtained by the lithographic processing using the current process conditions described above. By way of example, the resist sensitivity described in TABLE 8 refers to an electron dosage for a line width of 150 nm.

Finally, the configurations and structures of respective units and portions described specifically with respect to the: preferred embodiments of the present invention are only examples of the realization of the present invention, so the embodiments thereof should not be construed to limit the technical scope of the present invention.

What is claimed is:

1. A method of lithography for forming a resist pattern, comprising the steps of:

forming said resist pattern on the basis of an orthogonal experiment, wherein a factor for said orthogonal experiment includes a process condition of said lithography;

obtaining a line edge roughness of said resist pattern as a characteristic value for evaluation;

setting a reference level (benchmark) and its value for each of said factors in said orthogonal experiment;

selecting an optimal reference level and its optimal value from a combination thereof set in said orthogonal experiment that minimizes said line edge roughness; and performing the lithography based on said optimal reference level and said optimal value.

2. The method of lithography as claimed in claim 1, wherein said orthogonal experiment is conducted based on an orthogonal table.

3. The method of lithography as claimed in claim 1, wherein said process condition as said factor comprises a process temperature and a process time in a hexamethyldisilazane (HMDS) process.

4. The method of lithography as claimed in claim 1, wherein said process condition as said factor comprises a process temperature and a process time in a pre-bake (PB) process.

5. The method of lithography as claimed in claim 1, wherein said process condition as said factor comprises a process temperature and a process time in a post-exposure bake (PEB) process.

6. The method of lithography as claimed in claim 1, wherein said process condition as said factor comprises a temperature of a developing solution, a developing time and a concentration of said developing solution in a developing process.

7. The method of lithography as claimed in claim 1, wherein said process condition as said factor comprises a process temperature and a process time in a post-bake process.

8. A method of lithography for forming a resist pattern, comprising the steps of:

forming said resist pattern on the basis of an orthogonal experiment, wherein a factor for said orthogonal experiment includes a process condition of said lithography;

obtaining a line edge roughness of said resist pattern; and selecting a reference value for said factor, wherein said factor minimizes said line edge roughness.

9. The method of lithography as claimed in claim 8, wherein said orthogonal experiment is based on an orthogonal table.

10. The method of lithography as claimed in claim 8, wherein said process condition includes a process temperature and a process time in a hexamethyldisilazane process.

11. The method of lithography as claimed in claim 8, wherein said process condition includes a process temperature and a process time in a pre-bake process.

12. The method of lithography as claimed in claim 8, wherein said process condition includes a process temperature and a process time in a post-exposure bake process.

13. The method of lithography as claimed in claim 8, wherein said process condition includes a temperature of a developing solution, a developing time and a concentration of said developing solution in a developing process.

14. The method of lithography as claimed in claim 8, wherein said process condition includes a process temperature and a process time in a post-bake process.

* * * * *